US012624447B2

(12) United States Patent
Chiang et al.

(10) Patent No.: US 12,624,447 B2
(45) Date of Patent: May 12, 2026

(54) SEMICONDUCTOR PROCESS CHAMBER WITH IMPROVED REFLECTOR

(71) Applicant: TAIWAN SEMICONDUCTOR MANUFACTURING COMPANY, LTD., Hsinchu (TW)

(72) Inventors: Sou-Chuan Chiang, Hsinchu (TW); Chia Hung Liu, Hsinchu (TW); Yen Chuang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 455 days.

(21) Appl. No.: 17/837,910

(22) Filed: Jun. 10, 2022

(65) Prior Publication Data

US 2023/0399742 A1     Dec. 14, 2023

(51) Int. Cl.
| | |
|---|---|
| *C23C 16/452* | (2006.01) |
| *C23C 16/458* | (2006.01) |
| *C23C 16/46* | (2006.01) |

(52) U.S. Cl.
CPC ........ *C23C 16/452* (2013.01); *C23C 16/4583* (2013.01); *C23C 16/463* (2013.01)

(58) Field of Classification Search
None
See application file for complete search history.

(56) References Cited

U.S. PATENT DOCUMENTS

| | | | |
|---|---|---|---|
| 2009/0314205 A1* | 12/2009 | Patalay | G02B 23/2492 |
| | | | 118/713 |
| 2016/0020086 A1 | 1/2016 | Tsai et al. | |
| 2017/0103907 A1* | 4/2017 | Chu | H01J 37/32724 |
| 2019/0127851 A1* | 5/2019 | Lau | B23K 26/0006 |
| 2019/0393058 A1* | 12/2019 | Kawakami | G01J 5/061 |
| 2020/0357664 A1* | 11/2020 | Hung | H01L 21/67115 |

* cited by examiner

*Primary Examiner* — Jeffrie R Lund
*Assistant Examiner* — Tiffany Z Nuckols
(74) *Attorney, Agent, or Firm* — NZ Carr Law Office

(57) ABSTRACT

A substrate processing chamber for performing an epitaxial deposition process is provided. The chamber includes a substrate support having an upper surface, a reflector disposed above the substrate support. The reflector includes a body comprising an upper opening having a first diameter, a bottom opening having a second diameter less than the first diameter, and a flange protruding radially from an outer circumference of the body around the upper opening, wherein the flange comprises a plurality of holes. The chamber includes a plurality of heating elements disposed around the reflector, each heating element being operable to emit energy radiation, a plurality of support kits, each support kit comprising a bar member and a fastener removably coupled to the bar member, wherein the bar member and fastener are configured to secure to the respective hole in the flange so that the reflector is at a height that reduces blockage of the energy radiation and increases an amount of the energy radiation to be distributed across the upper surface of the substrate support. The chamber further includes a cooling plate coupled to the flange by the plurality of support kits, wherein the cooling plate comprises an opening sized to allow passage of the body of the reflector.

20 Claims, 15 Drawing Sheets

804

813a

804

813a

H4

811

809

813a

811

809

804

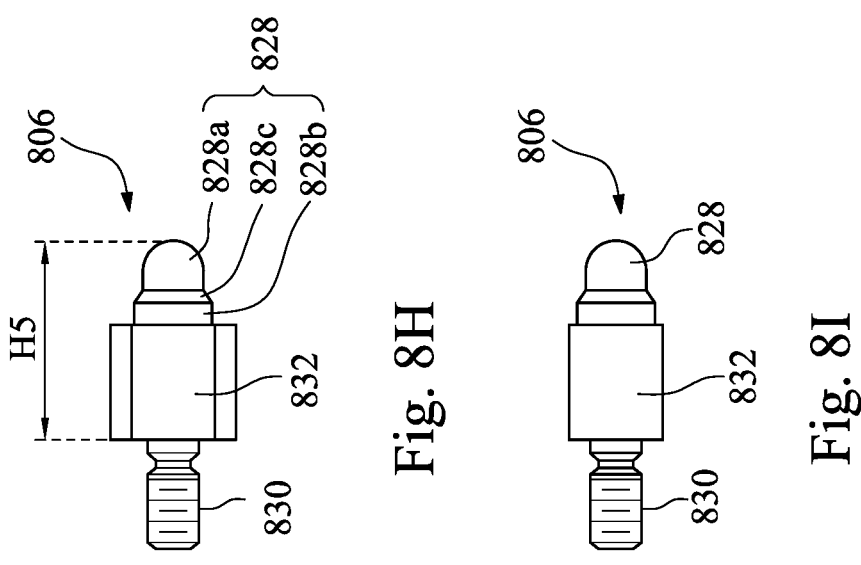
Fig. 8H
Fig. 8I
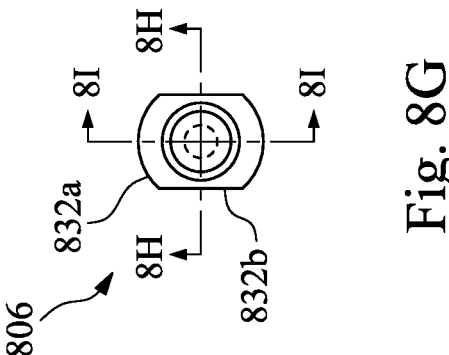
Fig. 8G
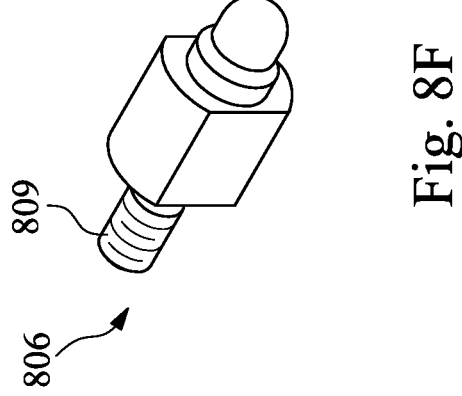
Fig. 8F

SEMICONDUCTOR PROCESS CHAMBER WITH IMPROVED REFLECTOR

BACKGROUND

Semiconductor substrates are processed for a wide variety of applications, including the fabrication of integrated devices and microdevices. During processing, such as an epitaxial process, the substrate is positioned on a rotating susceptor within a process chamber. Precise process control over a heating source (e.g., heating lamps) allows the substrate to be heated within very strict tolerances. The temperature of the substrate can affect the uniformity of the material deposited on the substrate. Despite the precise control of heating the substrate, improvement in thickness uniformity across the substrate has not been entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8F-8I illustrate various views of a fastener of FIG. 8B in accordance with some embodiments.

DETAILED DESCRIPTION

Figure 1:
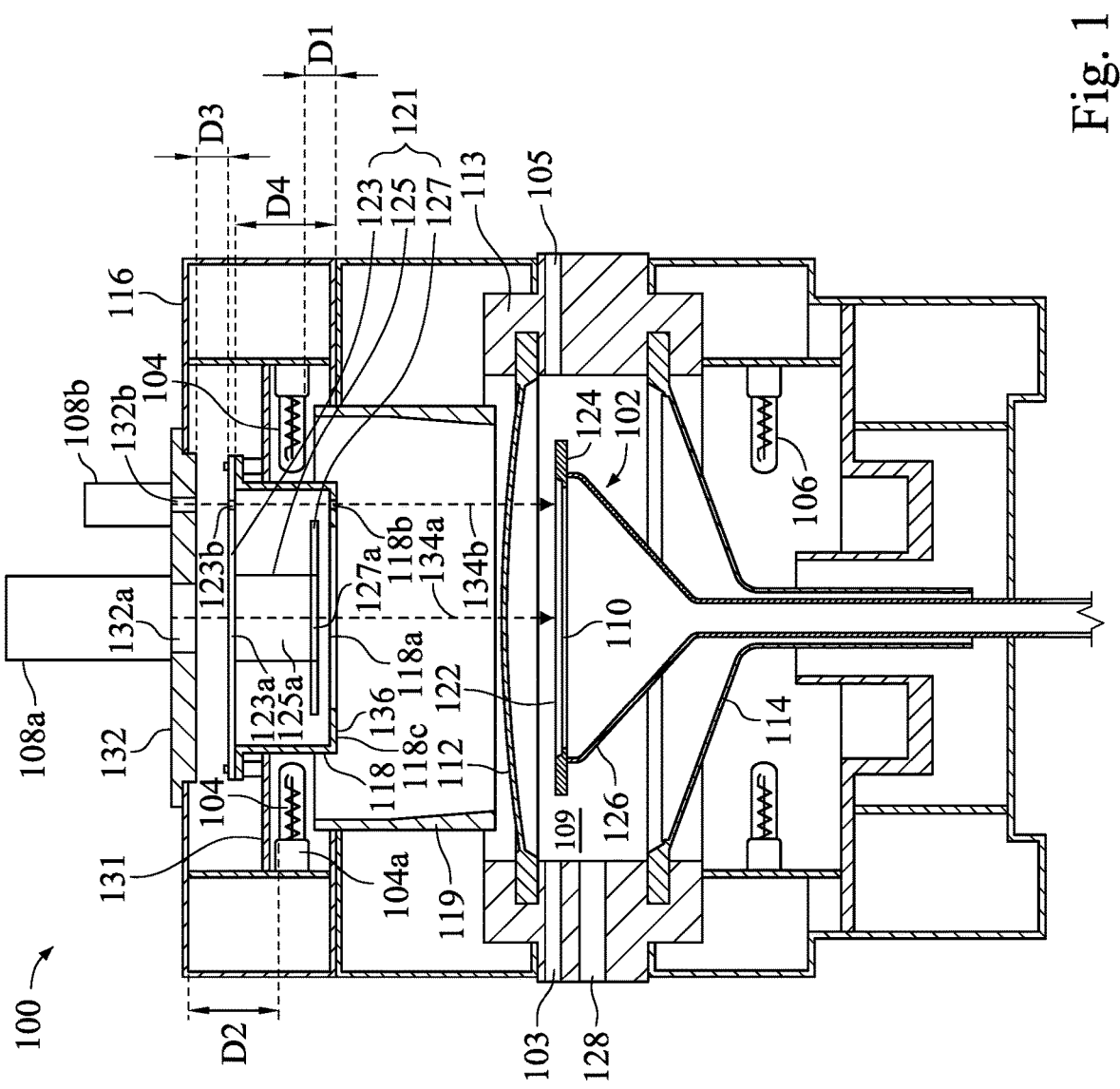
FIG. 1 is a schematic cross-sectional side view of a process chamber according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a process chamber 100 according to embodiments of the present disclosure. The process chamber 100 may be a process chamber for performing a thermal process, such as an epitaxial process. It is contemplated that while a process chamber for epitaxial process is shown and described, the concept of the present disclosure is also applicable to other process chamber that is capable of providing a controlled thermal cycle to heat a substrate for various processes, such as thermal annealing, thermal cleaning, thermal chemical vapor deposition, thermal oxidation, thermal nitridation, or any process in which gas dissociation and reaction may occur, regardless of whether the heating elements are provided at the top, bottom, or both of the process chamber.

The process chamber 100 may be used to process one or more substrates, including the deposition of a material on a deposition surface 122 of a substrate 110. The process chamber 100 may include an upper dome 112, a lower dome 114, a base ring 113, and a substrate support 102 disposed between the upper dome 112 and the lower dome 114. The upper and lower domes 112, 114 have peripheries that seal with the base ring 113. The base ring 113, together with the upper and lower domes 112, 114, define an internal volume 109 for processing the substrate 110. The upper dome 112 and the lower dome 114 may be constructed from an optically transparent material, such as quartz. The substrate support 102 may include a susceptor 124 having an upper surface for supporting the substrate 110. The substrate support 102 also includes a susceptor support 126 for supporting the susceptor 124. The susceptor 124 may be formed from silicon carbide or graphite coated with silicon carbide. The susceptor support 126 may be rotated by a motor (not shown), which in turn rotates the susceptor 124 and the substrate 110.

A gas inlet 103 may be formed through the base ring 113 into the internal volume 109, and a gas outlet 105 is formed through the base ring 113 on a side of the internal volume 109 opposing the gas inlet 103. The substrate 110 can be brought into and removed from the process chamber 100 through a loading port 128 formed in the base ring 113.

The process chamber 100 may further include a first plurality of heating elements 104 disposed above the upper dome 112, and a second plurality of heating elements 106 disposed below the lower dome 114. The first and second plurality of heating elements 104, 106 may be radiant heating lamps or the like. In some embodiments, the first and second plurality of heating elements 104, 106 provide infrared radiant energy to the susceptor 124 and the substrate 110 through the upper and lower domes 112, 114, respectively. The first and second plurality of heating elements 104, 106 may heat the substrate 110 to a temperature range of between about 250 degrees Celsius and about 1200 degrees Celsius. In one embodiment, the first and second plurality of heating elements 104, 106 are arranged in a circle around the upper and lower domes 112, 114, respectively. In some embodiments, the heating elements 104 are disposed at the same elevation.

The process chamber 100 also includes one or more thermal radiation sensors 108a, 108b, such as optical pyrometers, which measure thermal emissions of the substrate 110. The one or more thermal radiation sensors 108a, 108b may be disposed on a support member 132 which may be secured to a chamber lid 116. The thermal radiation sensors 108a, 108b may be disposed at different locations on the support member 132 to facilitate comparing the temperature at different locations of the substrate 110 and determine whether temperature anomalies or non-uniformities are present. For example, the thermal radiation sensor 108a may be disposed at a center of the support member 132. The thermal radiation sensor 108a produces a focal beam 134a for measuring the temperature at the center region of the substrate 110. The thermal radiation sensor 108b may be disposed radially outward of the thermal radiation sensor 108a. The thermal radiation sensor 108b produces a focal beam 134b for measuring the temperature at the edge region of the substrate 110.

The process chamber 100 has an inner reflector 118 and an outer reflector 119 disposed radially outward of the inner reflector 118. The inner and outer reflectors 118, 119 may have a substantial hollow, cylindrical shape. The inner reflector 118 may be supported by a cooling plate 131 positioned above the heating elements 104. In some embodiments, the inner reflector 118 is surrounded by the heating elements 104. While not shown, the cooling plate 131 may have internal grooves for circulating cooling fluid therein to help reduce the temperature of the process chamber 100. The inner reflector 118 is disposed over the upper dome 112 to reflect radiant energy that is radiating off the substrate 110 back onto the substrate 110. Likewise, the outer reflector 119 is disposed over the upper dome 112 and outside of the inner reflector 118 to reflect radiant energy that is radiating off the substrate 110 and the inner reflector 118 back onto the substrate 110. The inner and outer reflectors 118, 119 improve efficiency of the heating and thus thickness uniformity across the substrate 110. The inner and outer reflectors 118, 119 may be made of a metal such as aluminum or stainless steel. The efficiency of the reflection can be further improved by coating the reflective surfaces of the inner and outer reflectors 118, 119 with a highly reflective coating, such as gold.

In some embodiments, a light guide assembly 121 may be further disposed on the inner reflector 118. The light guide assembly 121 may include a cover plate 123, a bridge member 125, and a central reflector 127 coupled to the cover plate 123 by the bridge member 125. The central reflector 127 and the bridge member 125 are surrounded by the inner reflector 118. The support member 132, the cover plate 123, the bridge member 125, the central reflector 127, and the inner reflector 118 each has a first opening 132a, 123a, 125a, 127a, 118a, respectively, to allow passage of the focal beam 134a. The support member 132, the cover plate 123, and the inner reflector 118 each has a second opening 132b, 123b, 118b, respectively, to allow passage of the focal beam 134b. In some embodiments, the central reflector 127 is sized according to the first opening 118a of the inner reflector 118 and used to reflect infrared light that is radiating off the substrate 110 and the inner reflector 118 back onto the substrate 110.

During operation, for example a selective epitaxial growth (SEG) of silicon germanium (SiGe) layers for source/drain applications of p-MOSFETs, a substrate, such as the substrate 110 on which source/drain regions are formed, is inserted into the internal volume 109 through the loading port 128 and located on top of the susceptor 124. A pump (not shown) connected to the gas outlet 105 is operated so that the internal volume 109 is maintained at a predetermined pressure (e.g., 10 Torr). The substrate 110 is heated by the heating elements 104 to a predetermined temperature, such as about 450 degrees Celsius to about 750 degrees Celsius. Processing gases, such as a silicon-containing precursor (e.g., dichlorosilane ($SiH_2Cl_2$) for silicon source), a germanium-containing precursor (e.g., germane ($GeH_4$) for germanium source), and a boron-containing precursor (e.g., borane ($BH_3$) for dopant source), are then introduced into the process chamber 100 through the gas inlet 103. An etchant gas (e.g., HCl) may be introduced into the gas mixture during the epitaxial process. The processing gases may be introduced in a laminar flow over an upper surface of the substrate 110 and then out of the gas outlet 105. The processing gases react with one another and form a layer on exposed crystalline surfaces of the source/drain regions. In the meantime, the presence of etchant molecules removes formed nuclei on the oxide surfaces (e.g., STI), thereby enabling/assisting selective epitaxial growth of SiGe. Despite the precise control of heating the substrate 110, one or more regions of the substrate 110 may experience temperature non-uniformity. For example, when the above SEG process is performed in a traditional process chamber, the temperature at the center of the substrate 110 may be lower than the edge of the substrate 110 partially due to interference with reflections off the inner reflector 118. The temperature non-uniformity leads to film thickness non-uniformity of a film deposited on the substrate in the one or more regions. Particularly, the thickness of the deposited SiGe layer can be undesirably reduced in the peripheral region (i.e., edge roll-off phenomenon) of the substrate 110. In order to improve temperature uniformity, which in turn improves film thickness non-uniformity and minimizes edge roll-off phenomenon discussed herein, the inner reflector 118 of various embodiments of this disclosure is arranged/configured so that the vertical distance D1 between the heating elements 104 and a bottom 118c of the inner reflector 118 is less than about 50 mm, such as about 15 mm to about 45 mm. In some embodiments, the distance D1 refers to a height difference between the bottom 118c of the inner reflector 118 and the exterior surface of the lamp bulb of the heating elements 104. In some embodiments, the distance D1 is a height difference measuring from the bottom 118c of the inner reflector 118 to the mounting base 104a of the heating elements 104. Having the distance D1 controlled to be less than about 50 mm can reduce blockage and/or reflection of energy radiation by the inner reflector 118 and allow more radiant energy (from the heating elements 104) to be directed on the substrate 110, which in turn improves the thickness uniformity of the deposited material across the substrate 110. On the other hand, if the distance D1 is less than about 15 mm, the inner reflector 118 may not serve its purpose for reflection of lights.

In some embodiments, the distance D2 between the chamber lid 116 and the heating elements 104 may be adjusted to be in a range of about 55 mm to about 75 mm, such as about 60 mm to about 70 mm. The distance D3 between the support member 132 and the cover plate 123 may be adjusted to be in a range of about 5 mm to about 20 mm, such as about 8 mm to about 15 mm. The inner reflector 118 may have a height D4 in a range of about 100 mm to about 125 mm, such as about 110 mm to about 120 mm. In various embodiments, the inner reflector 118 (and/or the heating elements 104) is arranged so that the height D4 and the distance D1 is at a ratio of about 1:0.4 or below, such as about 1:0.1 to about 1:0.3. FIGS. 4-9B show various embodiments of the inner reflector 118 and approaches that can be used to achieve the distance D1 being less than 50 mm.

Figures 2A, 2B, 2C:
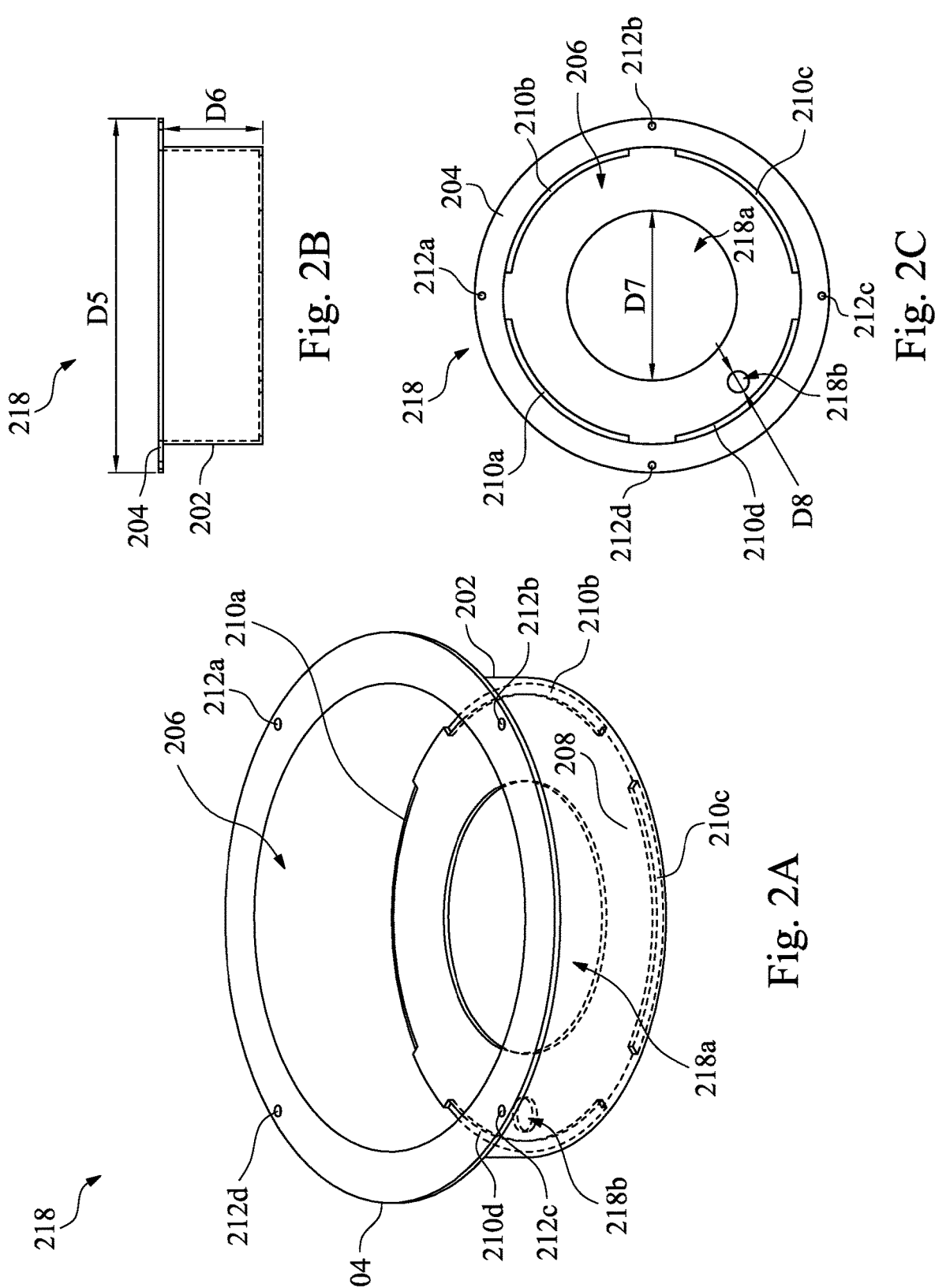
FIG. 2A schematically illustrates a perspective view of an inner reflector in accordance with some embodiments.
FIG. 2B is a cross-sectional view of the inner reflector of FIG. 2A.
FIG. 2C is a top view of the inner reflector of FIG. 2A.

FIG. 2A schematically illustrates a perspective view of an inner reflector 218 in accordance with some embodiments. The inner reflector 218 can be used in place of the inner reflector 118 of FIG. 1. FIG. 2B is a cross-sectional view of the inner reflector 218 of FIG. 2A. FIG. 2C is a top view of the inner reflector 218 of FIG. 2A. In one exemplary embodiment shown in FIG. 2A, the inner reflector 218 is shaped as a stockpot having a body 202 and a flange 204 annularly formed on and protrudes radially from an outer circumference of the body 202 around an upper opening 206 of the inner reflector 218. The inner diameter of the flange 204 defines the upper opening 206 of the inner reflector 218. The flange 204 may have an outer diameter D5 (FIG. 2B) in a range of about 310 mm to about 380 mm, such as about 330 mm to about 360 mm, for example about 345 mm. The body 202 may have a height D6 in a range of about 100 mm to about 130 mm, such as about 110 mm to about 120 mm, for example about 115 mm. The body 202 has a bottom 208 having a diameter corresponding to the inner diameter of the flange 204. The bottom 208 of the body 202 has a first opening 218a, the second opening 218b, and optionally a plurality slots 210a-210d (collectively referred to as 210) formed through the bottom 208 of the inner reflector 218.

Each slot 210 may have a width in a range of about 3 mm to about 7 mm, for example about 5 mm. The slots 210 may be evenly spaced around the periphery of the bottom 208. In one embodiment, the bottom 208 has four (4) slots. However, more or less slots 210 are contemplated. The first opening 218a is concentric with the top opening 206 and may have a diameter D7 of about 130 mm to about 200 mm, for example about 165 mm. The second opening 218b is disposed between the slot 210d and the first opening 218a and may have a diameter D8 of about 10 mm to about 30 mm, for example about 20 mm. The flange 204 of the inner reflector 218 includes a plurality of through holes 212a-212d (collectively referred to as holes 212). Each hole 212 may have a diameter in a range of about 4 mm to about 8 mm, for example about 6 mm. The holes 212 may be evenly spaced around the flange 204. As will be discussed in more detail below, the holes 212 are configured to work with various support kits to secure the cover plate 123 (FIG. 1) and the inner reflector 218 to a chamber component, such as the cooling plate 131 (FIG. 1) that is positioned above the heating elements 104.

Figures 3A, 3B, 3C, 3D, 3E:
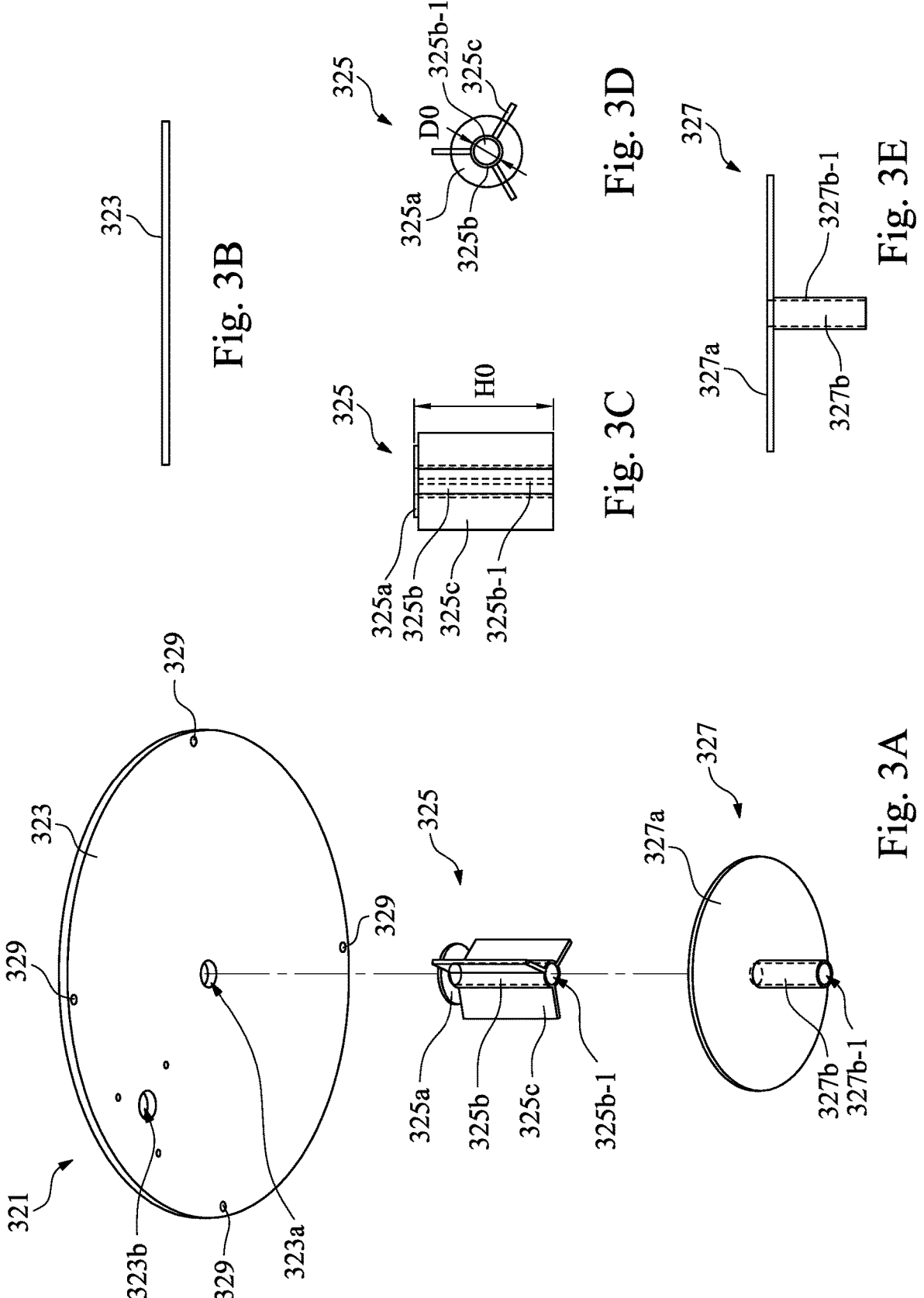
FIG. 3A is an exploded view of a light guide assembly in accordance with some embodiments.
FIG. 3B is a cross-sectional view of the cover plate of FIG. 3A.
FIGS. 3C and 3D are cross-sectional view and top view of the bridge member of FIG. 3A.
FIG. 3E is a cross-sectional view of the central reflector of FIG. 3A.

FIG. 3A is an exploded view of a light guide assembly 321 in accordance with some embodiments. The light guide assembly 321 generally includes a cover plate 323, a bridge member 325, and a central reflector 327. The light guide assembly 321 can be used in place of the light guide assembly 121 of FIG. 1. FIG. 3B is a cross-sectional view of the cover plate 323 of FIG. 3A. FIGS. 3C and 3D are cross-sectional view and top view of the bridge member 325 of FIG. 3A. FIG. 3E is a cross-sectional view of the central reflector 327 of FIG. 3A. As shown in FIG. 3A, the cover plate 323 is a circular plate having a first opening 323a and a second opening 323b. The cover plate 323 may have an outer diameter in a range of about 310 mm to about 340 mm, such as about 315 mm to about 335 mm, for example about 325 mm. The locations of the first and second openings 323a, 323b are arranged so that the focal beams 134a, 134b from the thermal radiation sensors 108a, 108b can pass through. The cover plate 323 further includes a plurality of holes 329 sized to allow passage of a portion of a bar member 404 of a support kid 400 (FIG. 4), thereby preventing radial movements of the light guide assembly 321 during the process. The holes 329 are arranged in accordance with the location of the support kid 400 (FIG. 4) on the cooling plate 131.

The bridge member 325 may have a height H0 in a range of about 90 mm to about 120 mm, such as about 100 mm to about 110 mm. The bridge member 325 generally includes a base 325a coupled to the cover plate 323, a tube 325b coupled to the base 325a, and a plurality of blades 325c extending radially from an exterior surface of the tube 325b. The base 325a has an opening leading to an opening 325b-1 (see also FIGS. 3C and 3D) of the tube 325b. The opening 325b-1 and the opening of the base 325a generally correspond to the first opening 323a of the cover plate 323 to allow passage of the focal beam 134a. In one embodiment, the opening 325b-1 has a diameter DO in a range of about 10 mm to about 30 mm, such as about 15 mm to about 25 mm, for example about 20 mm.

The central reflector 327 generally includes a base 327a and a tube 327b coupled to the base 327a. The base 327a is coupled to a side of the tube 325b and the blades 325c of the bridge member 325. Likewise, the base 327a has an opening leading to an opening 327b-1 of the tube 327b. The opening 327b-1 (see also FIG. 3E) and the opening of the base 327a generally correspond to the cover plate 323 to allow passage of the focal beam 134a. The central reflector 327 is sized according to the bottom opening of the inner reflector, such as the first opening 218a of the inner reflector 218 (FIG. 2A), so that infrared light that is radiating off the substrate 110 and the inner reflector 218 is reflected back onto the substrate 110.

Figure 4:
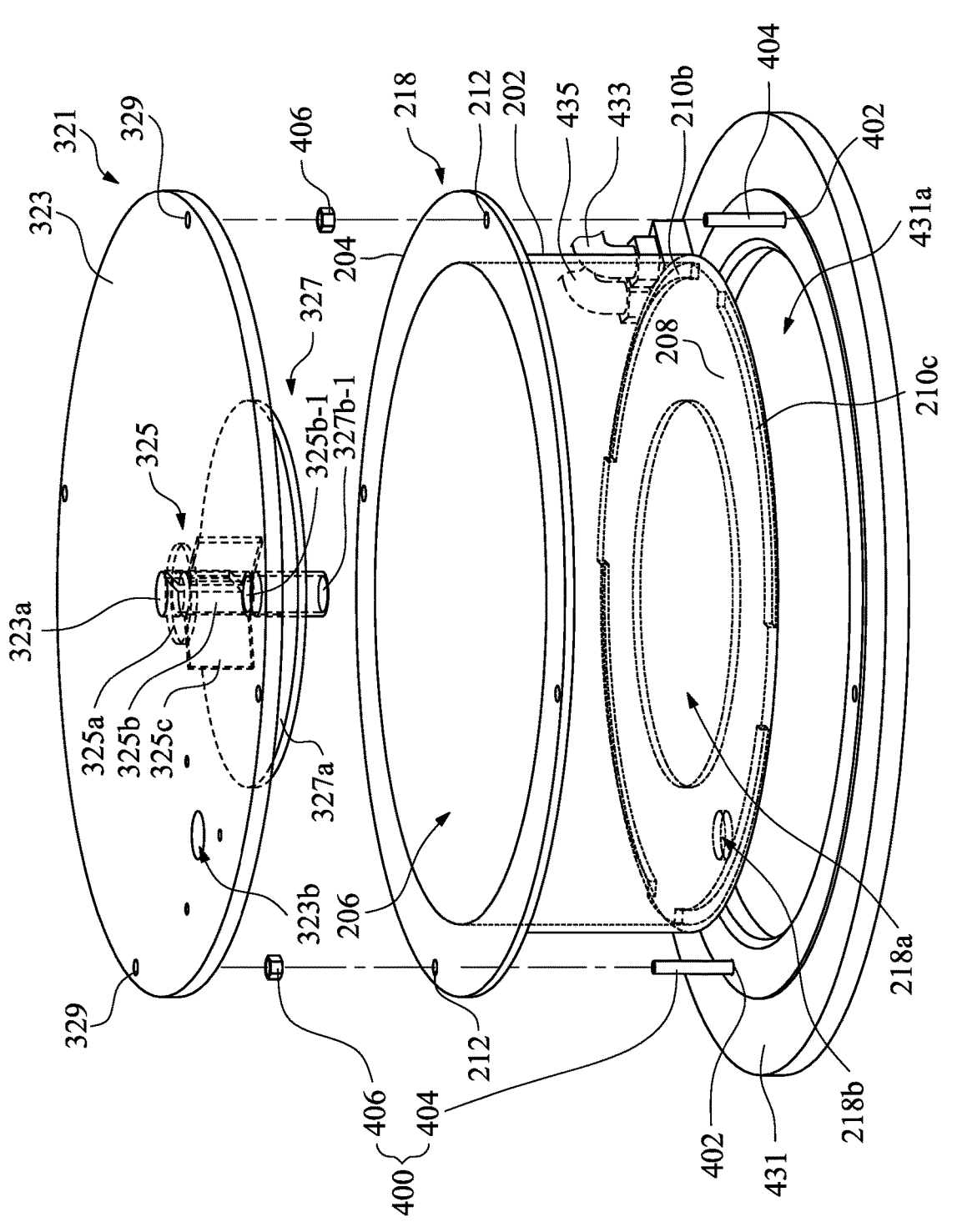
FIG. 4 is an exploded view of an inner reflector and a light guide assembly prior to securing to a cooling plate in accordance with some embodiments.

FIG. 4 is a perspective view of the inner reflector 218 and the light guide assembly 321 prior to securing to a cooling plate 431 in accordance with some embodiments. The cooling plate 431 may be the cooling plate 131 of FIG. 1. The cooling plate 431 has internal grooves (not shown) connected to an inlet 433 and an outlet 435 for circulating a cooling fluid. For the sake of clarity, only parts of the cooling plate 431 associated with the inner reflector 218 and the light guide assembly 321 are shown and discussed. The cooling plate 431 has an opening 431a sized to allow the body 202 of the inner reflector 218 to pass through. A plurality of threaded holes 402 (e.g., four (4)) are provided on the top surface of the cooling plate 431. The threaded holes 402 may be evenly spaced around the cooling plate 431. Each threaded hole 402 is configured to receive a support kit 400 which is used for adjusting the elevation of the inner reflector 218 with respect to the cooling plate 431. With the use of the support kit 400, the distance D1 (FIG. 1) between the bottom 208 of the inner reflector 218 and heating elements 104 can be adjusted to be less than about 50 mm, thereby allowing greater coverage of light onto the substrate 110 and thus improved thickness uniformity of the deposited material across the substrate 110.

In some embodiments, the support kit 400 includes a bar member 404 and a fastener 406. The bar member 404 has one end that is removably coupled to the threaded holes 402 of the inner reflector 218 and another end that is configured to secure with the fastener 406. In operation, the inner reflector 218 is secured to the cooling plate 431 by allowing a portion of the bar member 404 to pass through the holes 212 disposed at flange 204 of the inner reflector 218. The flange 204 of the inner reflector 218 is thus rested on the bar member 404 and fastened between the bar member 404 and the fastener 406. Once the flange 204 of the inner reflector 218 is secured between the bar member 404 and the fastener 406, a portion of the bar member 404 may extend over the top of the fastener 406 and through corresponding holes 329 in the cover plate 323 of the light guide assembly 321. This allows the placement and confinement of the light guide assembly 321 on the inner reflector 218 during the process.

Figures 5A, 5B:
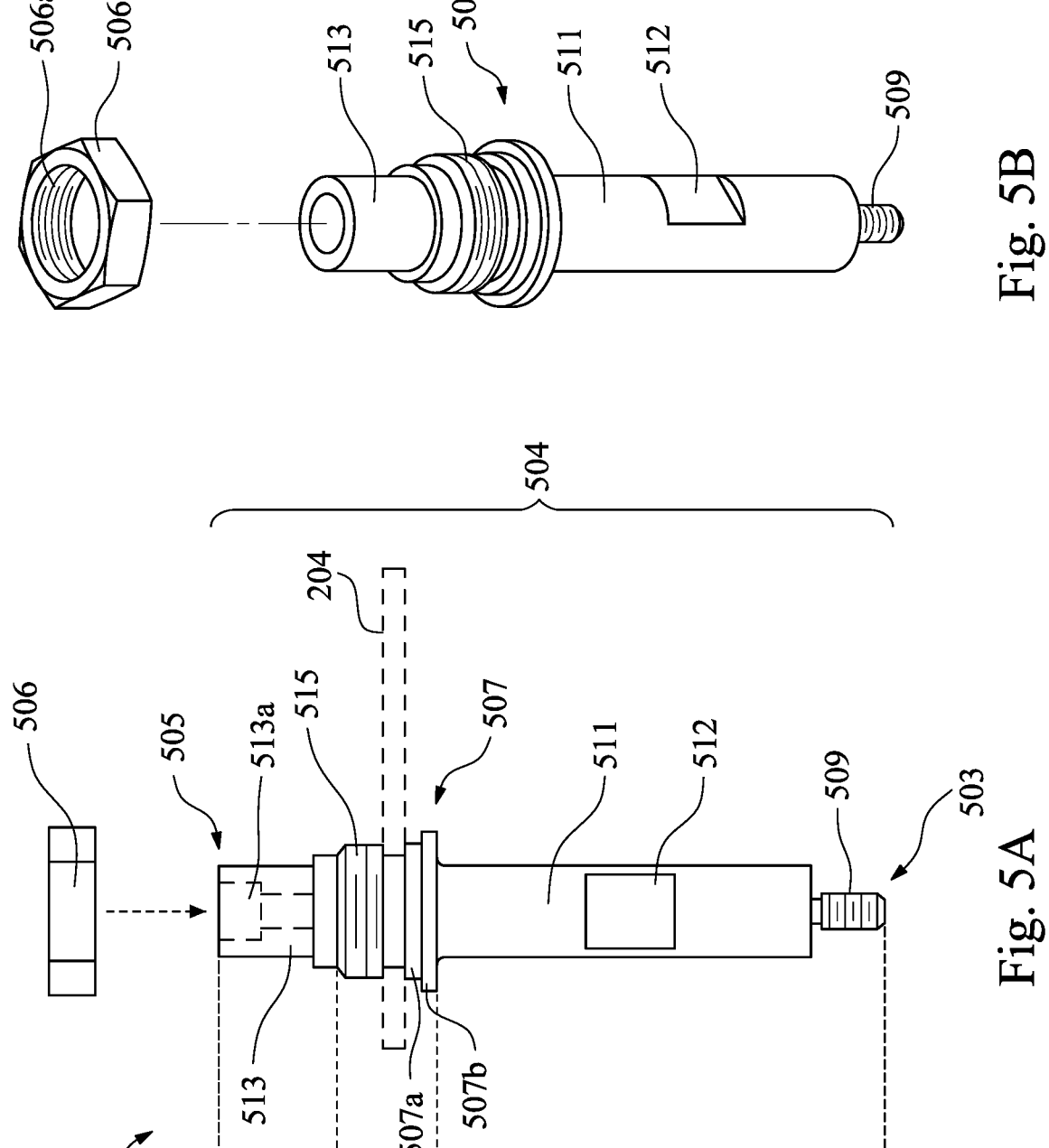
FIG. 5A illustrates a cross-sectional view of a support kit in accordance with some embodiments.
FIG. 5B is a perspective view of the support kit of FIG. 5A.

FIG. 5A illustrates a cross-sectional view of a support kit 500 in accordance with some embodiments. FIG. 5B is a perspective view of the support kit 500 of FIG. 5A. The support kit 500 can be used in place of the support kit 400 of FIG. 4. The support kit 500 includes a bar member 504 and a fastener 506. The bar member 504 may be a bolt-like fastener having a first end 503 and a second end 505 opposing the first end 503. The bar member 504 may have a flange portion 507, a shank 511 coupling to the flange portion 507, and a first thread portion 509 extending from the shank 511 to the first end 503. The shank 511 may have a diameter of about 6 mm to about 15 mm, for example about 10 mm. The shank 511 is disposed between the flange portion 507 and the first thread portion 509. The shank 511 may have an indentation 512 formed in the exterior surface of the shank 511 to help gripping when a torque is applied to the bar member 504. The indentation 512 may have a square or rectangular shape. The first thread portion 509 is sized so that it can be driven into the threaded holes 402 (FIG. 4) of the cooling plate 431. The bar member 504 further includes a head portion 513 and a second thread portion 515 disposed between the head portion 513 and the flange portion 507. The head portion 513 is extended from the second thread portion 515 to the second end 505. The flange portion 507 may have top and bottom sections 507a, 507b. The top section 507a is immediately adjacent to the second thread portion 515, and the bottom section 507b is immediately adjacent to the shank 511. The top and bottom sections 507a, 507b have different outer diameters such that the top section 507a provides a stage for supporting the flange 204 (represented by dotted lines) of the inner reflector 218 thereon. In such a case, the top section 507a may have an outer diameter larger than the holes 212 of the inner reflector 218.

The second thread portion 515 has threads that mate with the internal threads 506a of the fastener 506. The fastener 506 may be a nut-like fastener with a wrench-type of shape in order to help tighten or loosen the fastener 506. Once secured, the fastener 506 holds the flange 204 against the top section 507a so that the inner reflector 218 maintains a fixed position relative to the support kit 500. Upon installation, a portion of the bar member 504 may extend over the top of the fastener 506 and through corresponding holes 329 in the cover plate 323 of the light guide assembly 321 (FIG. 4), allowing the light guide assembly 321 to rest on the fastener 506. Additionally or alternatively, the head portion 513 may have a recess 513a to accommodate a pin (not shown). The pin can be removably attached to the head portion 513 and is sized to pass through the corresponding hole 329 in the cover plate 323. The recess 513a works with the pin to support and confine radial movements of the light guide assembly 321 during the process.

The bar member 504 may have a height H1 in a range of about 60 mm to about 120 mm, such as about 80 mm to about 95 mm. The shank 511 and the first thread portion 509 may have a combined height H2. The head portion 513 may have a height H3. In various embodiments, the height H2 and the height H3 may be at a ratio (H2:H3) of about 3:1 or greater, such as about 4:1 to about to 6:1. If the ratio (H2:H3) is less than about 3:1, the distance D1 (FIG. 1) between the heating elements 104 and a bottom of the inner reflector 218 may be greater than about 50 mm, resulting in non-uniformity of the material deposited on the substrate as discussed previously. On the other hand, if the ratio (H2:H3) is greater than about 6:1, the benefit of the provision of the inner reflector 218 may be diminished. In any case, the ratio (H2:H3) is configured so that the distance D1 (FIG. 1) between the heating elements 104 and a bottom of the inner reflector 118 is less than about 50 mm, such as about 15 mm to about 45 mm. Stated differently or alternatively, the ratio (H2:H3) is configured so that the bottom 208 of the inner reflector 218 is substantially at the same elevation as the heating elements 104.

Figures 6A, 6B, 6C, 6D, 6E:
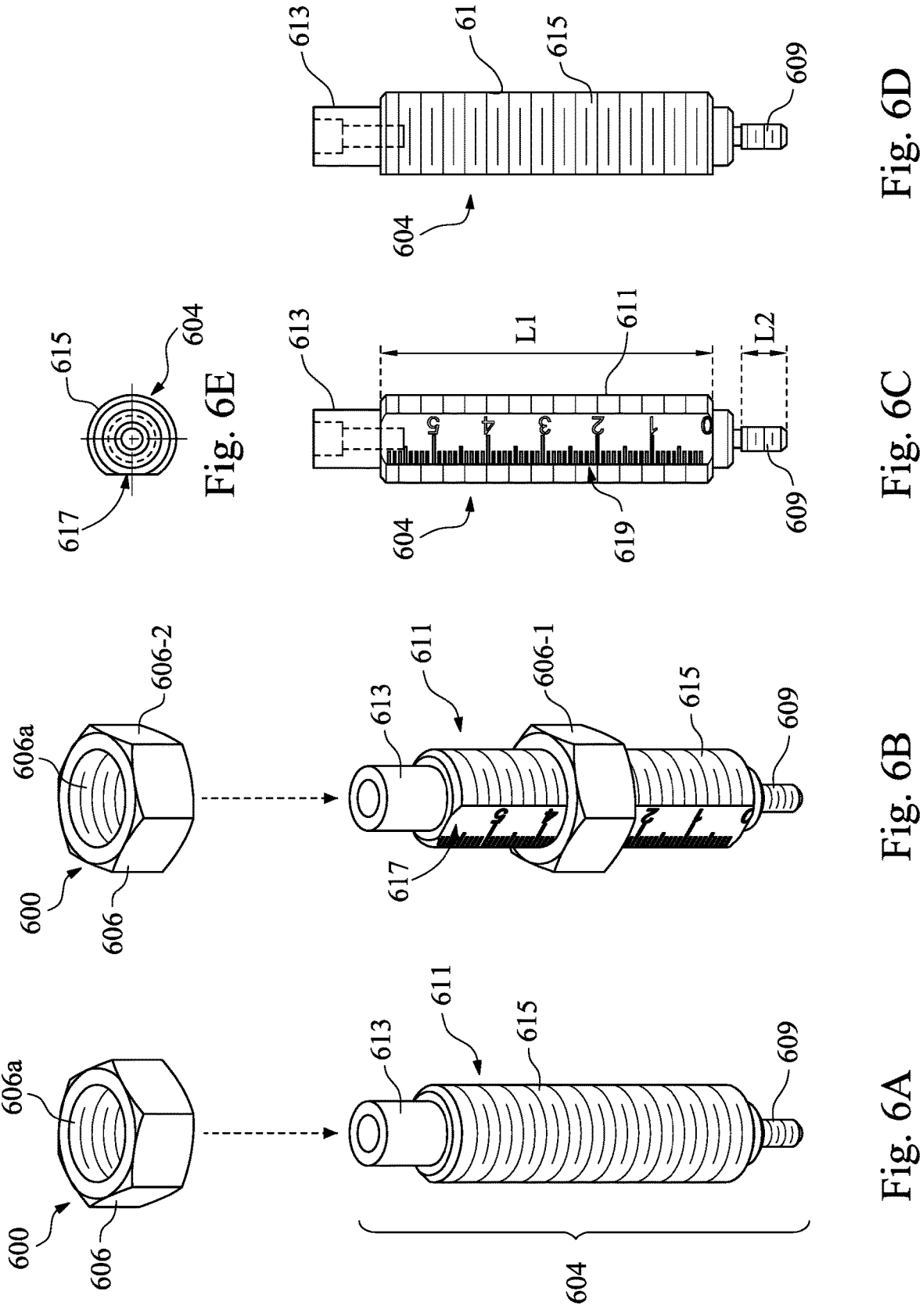
FIG. 6A is a perspective view of a support kit in accordance with some embodiments.
FIG. 6B is the perspective view of a bar member of FIG. 6A pairing with fasteners.
FIG. 6C is a cross-sectional view of the bar member of FIG. 6A from a first viewing angle.
FIG. 6D is a cross-sectional view of the bar member of FIG. 6A from a second viewing angle opposing the first viewing angle.
FIG. 6E is a top view of the bar member of FIG. 6B.

FIG. 6A is a perspective view of a support kit 600 in accordance with some embodiments. The support kit 600 can be used in place of the support kit 400 of FIG. 4. The support kit 600 includes a bar member 604 and one or more mating fasteners 606 (e.g., 606-1, 606-2 shown in FIG. 6B). The fasteners 606 may be a nut-like fastener with a wrench-type of shape. The bar member 604 have a head portion 613, a first thread portion 609, and a shank 611 disposed between the head portion 613 and the first thread portion 609. The shank 611 is greater in diameter than the first thread portion 609. The first thread portion 609 is sized so that it can be driven into the threaded holes 402 (FIG. 4) of the cooling plate 431. The shank 611 has an outer diameter substantially corresponding to the holes 212 of the inner reflector 218. The shank 611 has a flat surface 617 (FIG. 6B) and a curved (e.g., round) surface covered with a second thread portion 615. In some embodiments, the flat surface 617 and the second thread portion 615 extend along the entire length of the shank 611. The second thread portion 615 covers the exposed surface of the shank 611 except the flat surface 617. The flat surface 617 may be engraved with a height measurement scale 619. The second thread portion 615 mates with the internal threads 606a of the fastener 606. FIG. 6C is a cross-sectional view of the bar member 604 of FIG. 6A from a first viewing angle. FIG. 6D is a cross-sectional view of the bar member 604 of FIG. 6A from a second viewing angle opposing the first viewing angle. FIG. 6E is a top view of the bar member 604 of FIG. 6B.

In some embodiments, the shank 611 may have a length L1 in a range of about 45 mm to about 75 mm, such as about 55 mm to about 65 mm, for example about 60 mm. The first thread portion 609 may have a length L2 that is shorter than the shank 611. In various embodiments, the length L1 and the length L2 may be at a ratio (L1:L2) of about 4:1 to 6:1, for example about 5:1.

The fasteners 606 can be applied to the bar member 604 and move along the second thread portion 615 by turning the fasteners 606 in clockwise or counter-clockwise direction. Can be used to adjust the elevation of an inner reflector, such as the inner reflector 118, 218 discussed above. FIG. 6B is the perspective view of the bar member 604 of FIG. 6A pairing with fasteners 606-1, 606-2. In operation, the first fastener 606-1 may be first secured with the bar member 604 by applying the first fastener 606-1 to the bar member 604 at a pre-determined height. The inner reflector 218 is then disposed on the first fastener 606-1. The upper surface of the first fastener 606 provides a stage for supporting the flange 204 of the inner reflector 218. Next, the second fastener 606-2 is applied to the bar member 604 and torqued to secure the flange 204 of the inner reflector 218 between the first and second fasteners 606-1, 606-2. As a result, the inner reflector 218 is maintained at a fixed position relative to the support kit 600 and the cooling plate 431 (FIG. 4). Upon installation, a portion of the head portion 613 may extend over the top of the second fastener 606-2 and through corresponding holes 329 in the cover plate 323 of the light guide assembly 321 (FIG. 4), allowing the light guide assembly 321 to rest on the second fastener 606-2. Additionally or alternatively, the head portion 613 may have a recess 613a to accommodate a pin, which can be used to support and confine radial movements of the light guide assembly 321.

Figure 7B:
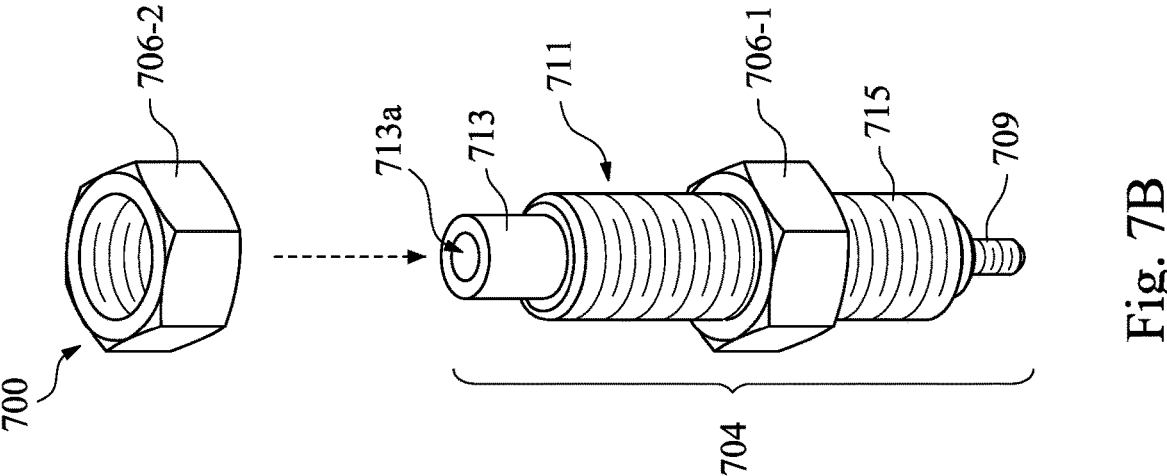
FIGS. 7A and 7B are perspective views of a support kit in accordance with some embodiments.
Figure 7A:
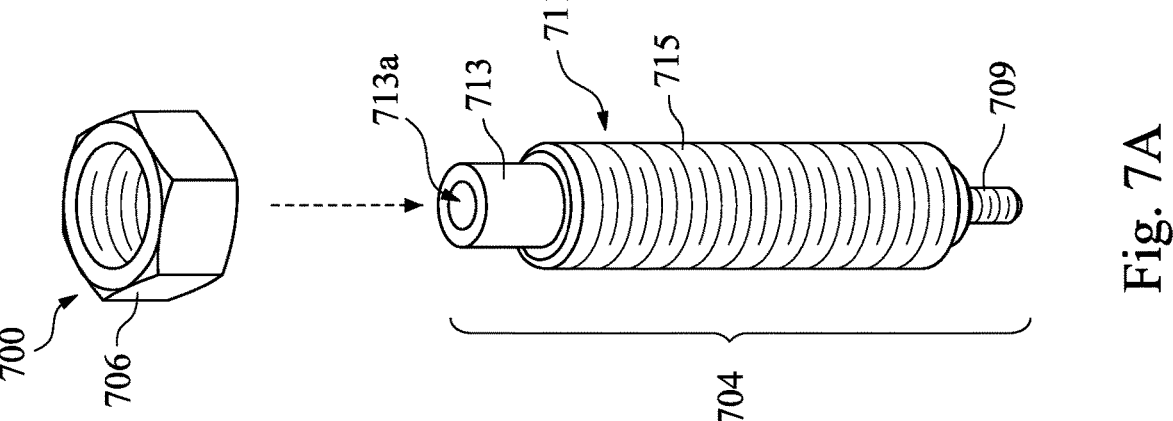

FIGS. 7A and 7B are perspective views of a support kit 700 in accordance with some embodiments. The support kit 700 can be used in place of the support kit 400 of FIG. 4. The support kit 700 includes a bar member 704 and one or more mating fasteners 706 (only one is shown). FIG. 7B is the perspective view of the bar member 704 of FIG. 7A pairing with fasteners 706-1, 706-2. The fasteners 706 may be a nut-like fastener with a wrench-type of shape. The bar member 704 has a head portion 713, a first thread portion 709, and a shank 711 disposed between the head portion 713 and the first thread portion 709. As opposed to the flat surface 617 of the support kit 600 shown in FIG. 6, the shank 711 has a second thread portion 715 disposed around the entire body of the shank 711. However, the support kit 700 functions similarly to the support kit 600 of FIG. 6. The fastener 706-1 can be applied to the bar member 704 for adjusting the elevation of the inner reflector 218 (FIG. 4). The fastener 706-2 can be tightened onto the second thread portion 715 of the bar member 704 to secure the flange 204 of the inner reflector 218 between the fasteners 706-1 and 706-2. The support kit 700 ensures the inner reflector 218 is maintained at a fixed position with respect to the cooling plate 431 and therefore the heating elements 104.

Upon installation, a portion of the head portion 713 may extend over the top of the second fastener 706-2 and into corresponding holes 329 in the cover plate 323 of the light guide assembly 321 (FIG. 4), allowing the light guide assembly 321 to rest on the fastener 706-2. Additionally or alternatively, the head portion 713 may have a recess 713a to accommodate a pin, which can be used to support and confine radial movements of the light guide assembly 321.

Figures 8A, 8B:
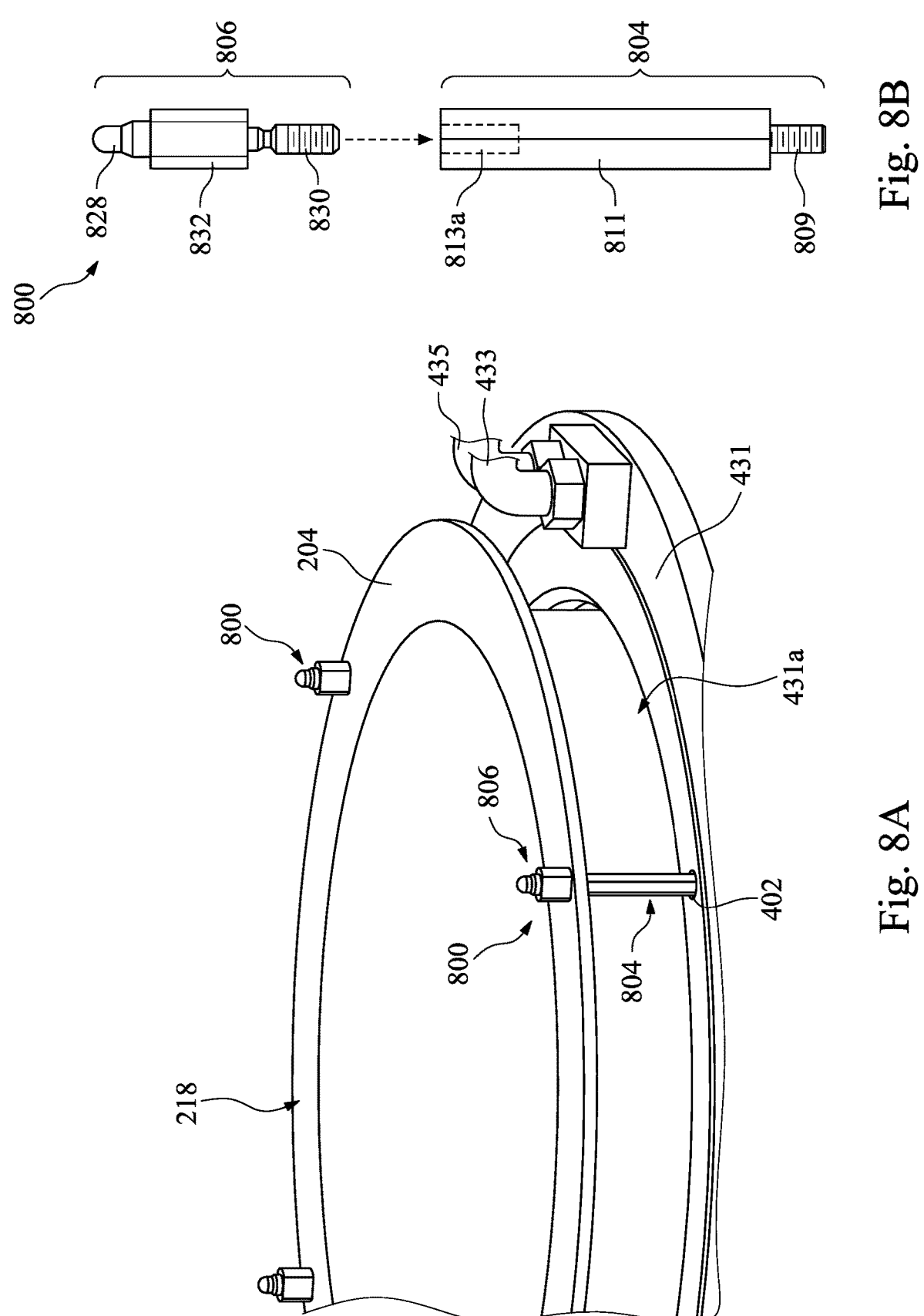
FIG. 8A is a perspective view showing a portion of an inner reflector securing to a cooling plate through a support kit in accordance with some embodiments.
FIG. 8B is a cross-sectional view of a bar member of FIG. 8A prior to assembly with a fastener.

FIG. 8A is a perspective view showing a portion of the inner reflector 218 securing to the cooling plate 431 through a support kit 800 in accordance with some embodiments. The support kit 800 generally includes a bar member 804 and a mating fastener 806. FIG. 8B is a cross-sectional view of the bar member 804 of FIG. 8A prior to assembly with the fastener 806. The bar member 804 has a shank 811 and a thread portion 809 extending out of the shank 811. The bar member 804 has a recess 813a with internal thread provided in the recess 813a. The fastener 806 has a head portion 828, a thread portion 830, and a connection body 832 disposed between the head portion 828 and the thread portion 830. The thread portion 830 is sized to pass through the hole 212 disposed at the flange 204 of the inner reflector 218. A portion of the thread portion 830 can be driven into the recess 813a of the bar member 804 to secure the inner reflector 218 in place.

Figure 8E:
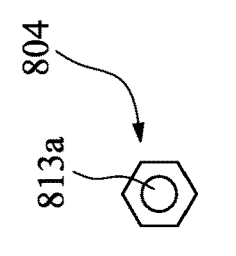
FIGS. 8C-8E illustrate various views of a bar member of FIG. 8B in accordance with some embodiments.
Figure 8D:
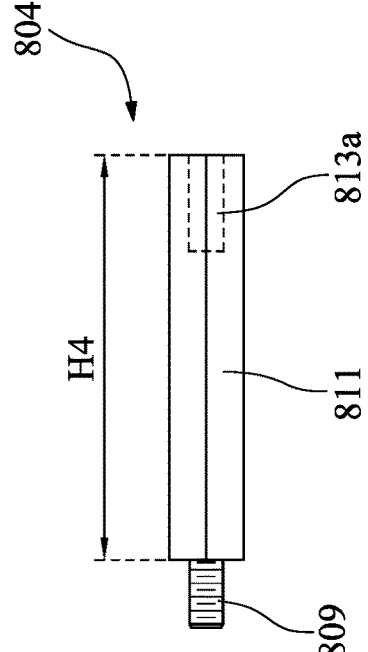
Figure 8C:
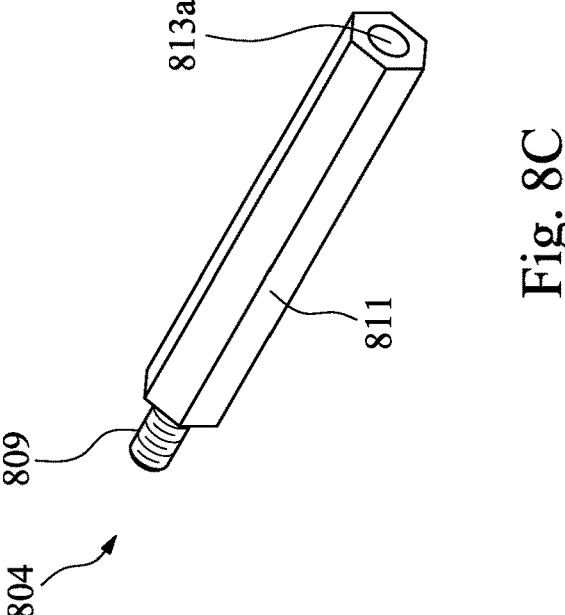

FIGS. 8C-8E illustrate various views of the bar member 804 in accordance with some embodiments. FIGS. 8F-8I illustrate various views of the fastener 806 in accordance with some embodiments. The shank 811 of the bar member 804 may have different cross-sectional shapes, such as round, square, hexagon, etc. In one embodiment shown in FIGS. 8E, the shank 811 has a hexagonal cross-sectional shape. As can be seen in FIGS. 8F-8G, the connection body 832 of the fastener 806 has a pair of rounded surfaces 832a and a pair of flat surfaces 832b. The head portion 828 may include multiple sections with different diameters. In one embodiment shown in FIG. 8H, the head portion 828 has a top section 828a having a first outer diameter, a bottom section 828b having a second outer diameter greater than the first outer diameter, and a middle section 828c disposed between the top and bottom sections 828a, 828b. The middle section 828c has a taper slant surface with an outer diameter gradually increasing from the first outer diameter to the second outer diameter. The fastener 806 is configured to support and confine radial movements of the light guide assembly 321. In some embodiments, the first outer diameter of the top section 828a may substantially correspond to the diameter of the holes 329. When placing the cover plate 323 (FIG. 4) over the inner reflector 218, the inner edge of the holes 329 is contacted and supported by the middle section 828c.

The shank 811 of the bar member may have a height H4 ranging between 50 mm to about 70 mm, for example about 60 mm. The head portion 828 and the connection body 832 may have a combined height H5. The height H4 and the height H5 may be at a ratio (H4:H5) of about 2:1 to 5:1, for example about 3:1. In various embodiments, the ratio (H4:H5) is configured so that the distance D1 (FIG. 1) between the heating elements 104 and a bottom of the inner reflector 118 is less than about 50 mm, such as about 15 mm to about 45 mm. If the ratio (H4:H5) is less than about 2:1, the distance D1 between the heating elements 104 and the bottom of the inner reflector 218 may be greater than about 50 mm, resulting in non-uniformity of the material deposited on the substrate as discussed previously. On the other hand, if the ratio (H4:H5) is greater than about 5:1, the benefit of the provision of the inner reflector 218 may be diminished.

Figures 9A, 9B:
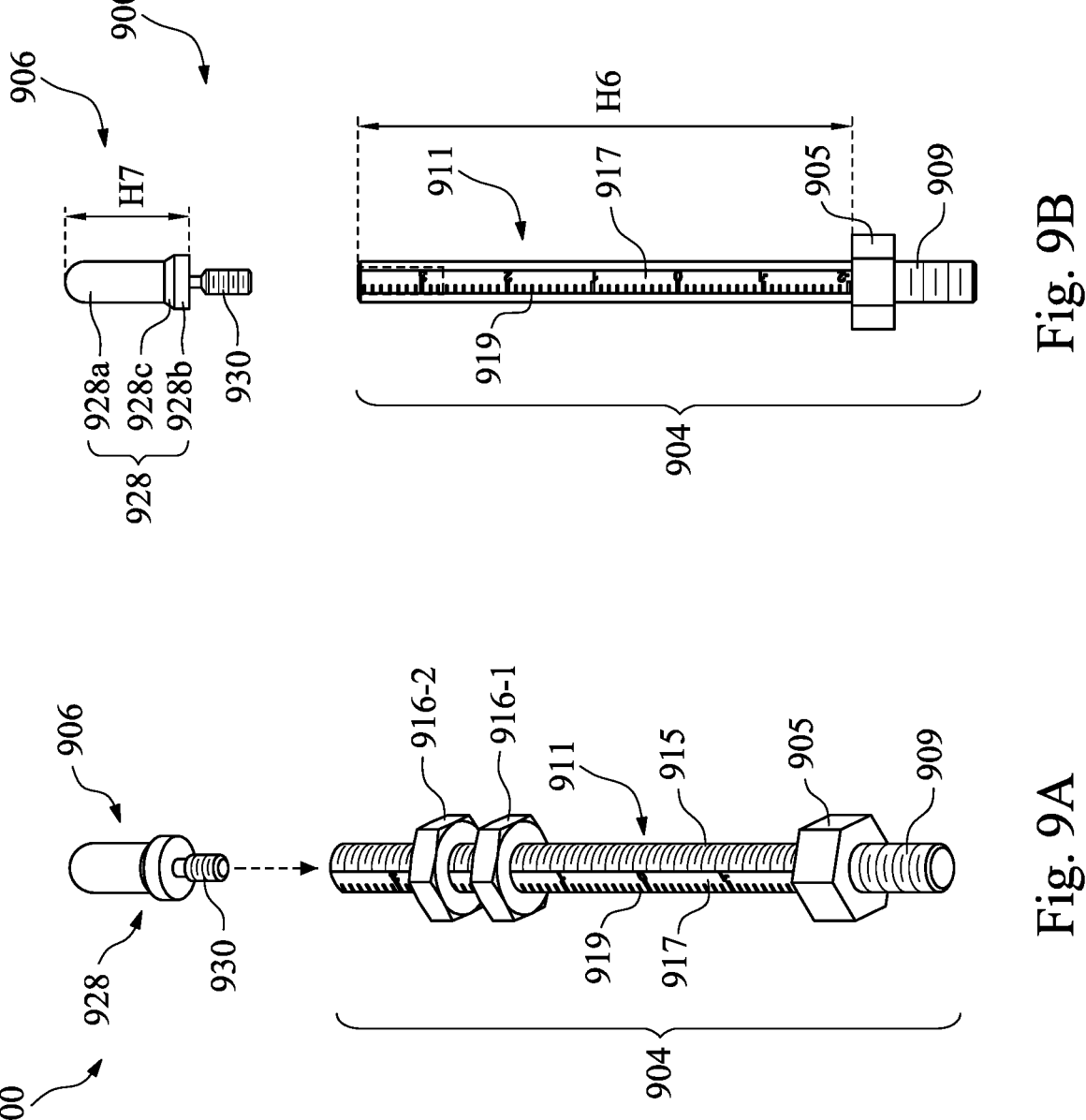
FIG. 9A is a perspective view of a support kit in accordance with some embodiments.
FIG. 9B is a cross-sectional view of a bar member and a cap of FIG. 9A.

FIG. 9A is a perspective view of a support kit 900 in accordance with some embodiments. The support kit 900 can be used in place of the support kit 400 of FIG. 4. In the embodiment shown in FIG. 9A, the support kit 900 includes a bar member 904, a cap 906, and at least two height adjusting members 916-1, 916-2 that can be removably coupled to the bar member 904. The height adjusting members 916-1 may be a nut-like fastener, such as the fasteners 606. The bar member 904 has a first thread portion 909, a shank 911, and a ridge portion 905 disposed between the first thread portions 909 and the shank 911. The first thread portion 909 and the shank 911 have substantially the same diameter. The ridge portion 905 may have a wrench-type of shape and a diameter larger than the shank 911. The first thread portion 909 can be driven into holes 402 of the cooling plate 431 (FIG. 4). The shank 911 comprises a flat surface 917 and a round surface covered with a second thread portion 915. In some embodiments, the second thread portion 915 and the flat surface 917 extend along the entire length of the shank 911. In some embodiments, the second thread portion 915 covers the exposed surface of the shank 911 except the flat surface 917. Likewise, the flat surface 917 may be engraved with a height measurement scale 919. The second thread portion 915 mates with the internal threads of the height adjusting members 916-1, 916-2. Similar to the fasteners 606-1, 606-2, the height adjusting members 916-1, 916-2 can be tightened to secure the flange 204 of the inner reflector 218 at a pre-determined height.

While not shown, the bar member 904 has a recess with internal thread provided in the recess. FIG. 9B is a side view of the bar member 904 and the cap 906 of FIG. 9A. The cap 906 has a body 928 and a thread portion 930 coupling to the body 928. The thread portion 930 can be driven into the recess of the bar member 904 to connect with the bar member 904. In one embodiment shown in FIG. 9B, the body 932 has a top section 928a having a first outer diameter, a bottom section 928b having a second outer diameter greater than the first outer diameter, and a middle section 928c disposed between the top and bottom sections 928a, 928b. The middle section 928c has a taper slant surface with an outer diameter gradually increasing from the first outer diameter to the second outer diameter. The cap 906 is configured to support and confine radial movements of the light guide assembly 321. In some embodiments, the first outer diameter of the top section 928a may substantially correspond to the diameter of the holes 329. When placing the cover plate 323 (FIG. 4) over the inner reflector 218, the inner edge of the holes 329 is contacted and supported by the middle section 928c.

The shank 911 has a height H6 and the body 928 has a height H7. The height H6 may be in a range of about 50 mm to about 70 mm, for example about 60 mm. The height H6 and the height H7 may be at a ratio (H6:H7) of about 2:1 to 5:1, for example about 3:1. In any case, the ratio (H6:H7) is configured so that the distance D1 (FIG. 1) between the heating elements 104 and a bottom of the inner reflector 118 is less than about 50 mm, such as about 15 mm to about 45 mm. If the ratio (H6:H7) is less than about 2:1, the distance D1 between the heating elements 104 and the bottom of the inner reflector 218 may be greater than about 50 mm, resulting in non-uniformity of the material deposited on the substrate as discussed previously. On the other hand, if the ratio (H6:H7) is greater than about 5:1, the benefit of the provision of the inner reflector 218 may be diminished.

Figures 10A, 10B:
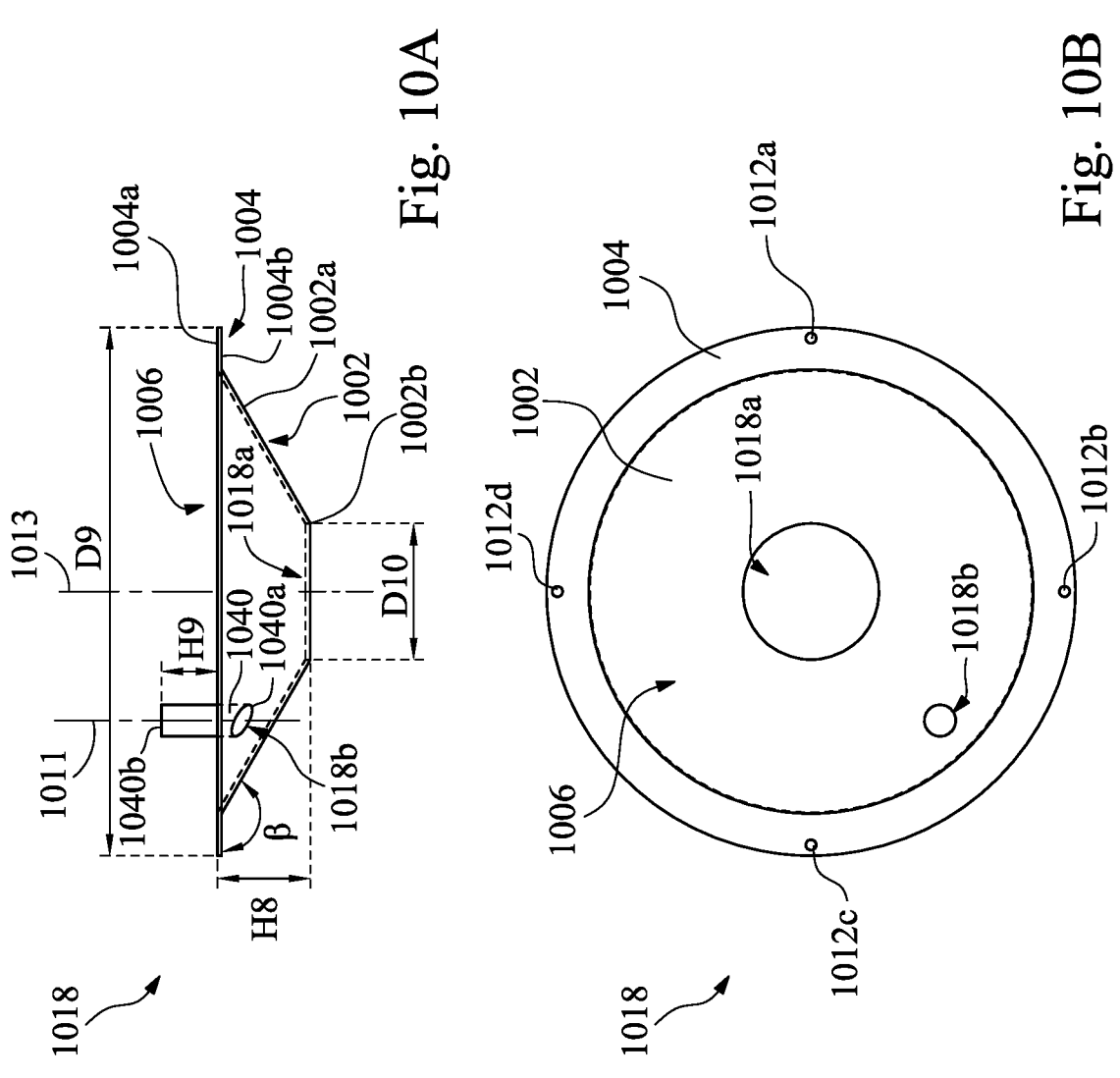
FIG. 10A is a cross-sectional view of an inner reflector in accordance with some embodiments.
FIG. 10B is a top view of the inner reflector of FIG. 10A.
Figure 11:
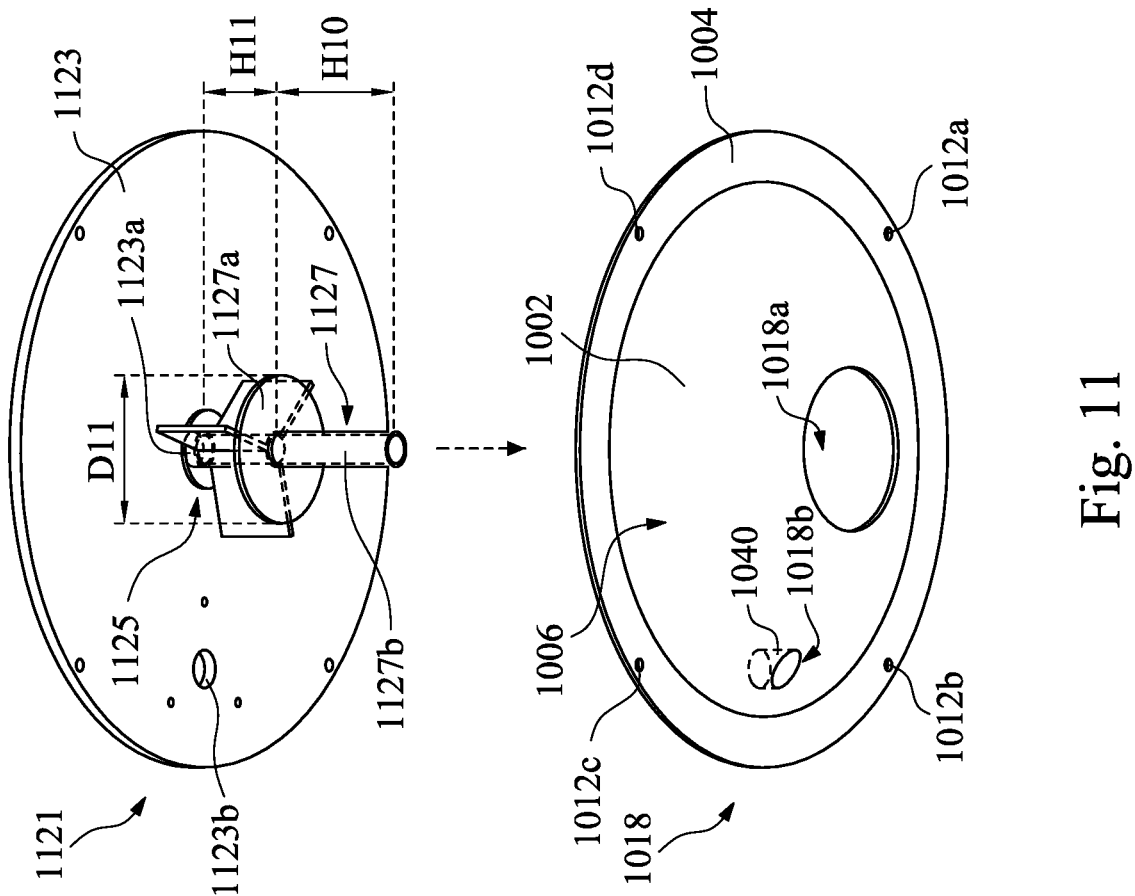
FIG. 11 illustrates a perspective view of a light guide assembly prior to securing to an inner reflector in accordance with some embodiments.

FIG. 10A is a cross-sectional view of an inner reflector 1018 in accordance with some embodiments. FIG. 10B is a top view of the inner reflector 1018 of FIG. 10A. The inner reflector 1018 can be used in place of the inner reflector 118 of FIG. 1. The inner reflector 1018 has a body 1002 and a flange 1004. The flange 1004 is annularly formed on and protruded radially from an outer circumference of the body 1002 around an upper opening 1006 of the inner reflector 1018. The inner diameter of the flange 1004 generally defines the upper opening 1006 of the inner reflector 1018. In some embodiments, the body 1002 has a truncated cone shape. The truncated cone shaped inner reflector 1018 enhances the amount of energy radiation at the center and peripheral of the substrate. Particularly, the body 1002 is shaped so that an angle "β" between the exterior surface 1002a of the body 1002 and the bottom surface 1004b of the flange 1004 is greater than 90 degrees, such as in a range of about 95 degrees to about 150 degrees, for example about 120 degrees to about 140 degrees. In some embodiments, the angle "β" is an obtuse angle. The bottom of the body 1002 defines a bottom opening 1018a. The upper opening 1006 and the bottom opening 1018a may be co-axial. The bottom opening 1018a has a diameter D10, which is sized in accordance with an outer diameter of a central reflector 1127 of a light guide assembly 1121 (FIG. 11).

In some embodiments, the body 1002 has a sensor light opening 1018b disposed between the bottom opening 1018a and the flange 1004. The locations of the bottom opening 1018a and the sensor light opening 1018b are chosen depending on the location of the thermal radiation sensors 108a, 108b, respectively. A tube 1040 is further integrated to the body 1002 of the inner reflector 1018 to allow passage of the focal beam 134b (FIG. 1) during operation. The tube 1040 also helps to minimize unwanted intervention of infrared radiant energy of the heating elements 104 with the focal beam 134a from the thermal radiation sensor 108a. The tube 1040 has a longitudinal axis 1011 parallel to a central axis 1013 of the inner reflector 1018. The tube 1040 has a first end 1040a terminating at the sensor light opening 1018b and a second end 1040b terminating at an elevation that is in flush with an upper surface 1004a of the flange 1004. In some embodiments, the second end 1040b is terminated at an elevation H9 that is about 5 mm to about 15 mm (e.g., about 10 mm) higher than the upper surface 1004a of the flange 1004. The inner reflector 1018 also includes a plurality of holes 1012a-1012d (collectively referred to as 1012) formed through the flange 1004. The holes 1012 are used to accommodate a support kit (e.g., support kit 400 in FIG. 4) for holding the inner reflector 1018 at a predetermined height with respect to the cooling plate 131 (FIG. 1). The holes 1012 may be evenly spaced around the flange 1004. In some embodiments, the holes 1012 are arranged in accordance with the location of the support kits 400-900 discussed in this disclosure.

The inner reflector 1018 may have a height H8 of about 110 mm or less, such as in a range of about 40 mm to about 80 mm, for example about 60 mm. The flange 1004 may have an outer diameter D9 in a range of about 300 mm to about 400 mm, for example about 340 mm to about 350 mm. The diameter D10 of the bottom opening 1018a may be in a range of about 70 mm to about 110 mm, such as about 85 mm to about 95 mm. In some embodiments, the height H8 and the diameter D10 of the bottom opening 1018a may be at a ratio (H8:D10) of about 1:1.2 to about 1:2, for example about 1.5:1. The outer diameter D9 and the diameter D10 may be at a ratio (D9:D10) of about 3:1 to about 5:1, for example about 4:1. In any case, the angle "β", the height H8, the outer diameter D9, and the diameter D10 are configured so that, once the inner reflector 1018 is installed on the cooling plate 131, the distance (e.g., distance D1 in FIG. 1) between the heating elements 104 and a bottom 1002b of the inner reflector 1018 is less than about 10 mm, such as about 0 mm to about 5 mm. In some embodiments, the angle "β", the height H8, the outer diameter D9, and the diameter D10 are configured so that the bottom 1002b of the inner reflector 1018 is at substantially the same elevation as the heating elements 104.

The inner reflector 1018 may be made of a metal such as aluminum or stainless steel. The efficiency of the reflection can be improved by coating the reflective surfaces of the inner reflector 1018 with a highly reflective coating, such as gold. In some embodiments, the exterior surface 1002a of the inner reflector 1018 may be treated (e.g., shot blasting, grit blasting, etc.) to enhance the reflectivity. Additionally or alternatively, the exterior surface 1002a may have a ridged surface or stepped profile running around the entire circumference of the body 1002 to help redirect energy radiation from the heating elements 104 at the center of the substrate, thereby improving the efficiency of the reflection and thickness uniformity of epitaxy process. In some embodiments, the cross-section of the body 1002 may be concave. In some embodiments, the cross-section of the body 1002 may be convex.

FIG. 11 illustrates a perspective view of a light guide assembly 1121 prior to securing to the inner reflector 1018 in accordance with some embodiments. In this embodiment, the light guide assembly 1121 is substantially identical to the light guide assembly 321 of FIG. 3A except that a bridge member 1125 and a central reflector 1127 of the light guide assembly 1121 are modified in accordance with the size of the bottom opening 1018a of the inner reflector 1018. Like the light guide assembly 321, the light guide assembly 1121 includes a cover plate 1123, the central reflector 1127, and the bridge member 1125 connecting the central reflector 1127 to the cover plate 1123. Particularly, a base 1127a of the central reflector 1127 is reduced in size to have an outer diameter D11 of about 50 mm to about 90 mm, such as about 60 mm to about 80 mm, for example about 65 mm. The tube 1127b is modified to have a height H10 in a range from 65 mm to about 100 mm, such as about 80 mm to about 95 mm, for example about 90 mm. The bridge member 1125 is also modified to have a height H11 in a range from 40 mm to about 65 mm, such as about 45 mm to about 55 mm, for example about 50 mm.

The cover plate 1123 has a first opening 1123a and a second opening 1123b. The locations of the first and second openings 1123a, 1123b are arranged to allow passage of the focal beams 134a, 134b (FIG. 1) from the thermal radiation sensors 108a, 108b. The cover plate 1123 may have an outer diameter substantially corresponding to the outer diameter D9 of the flange 1004. The light guide assembly 1121 may be connected to the inner reflector 1018 using the support kit 400 or any of the support kits 500-900 discussed in this disclosure so long as the distance (e.g., distance D1 in FIG. 1) between the heating elements 104 and the bottom 1002b of the inner reflector 1018 is less than about 10 mm, such as about 0 mm to about 5 mm.

Figure 12:
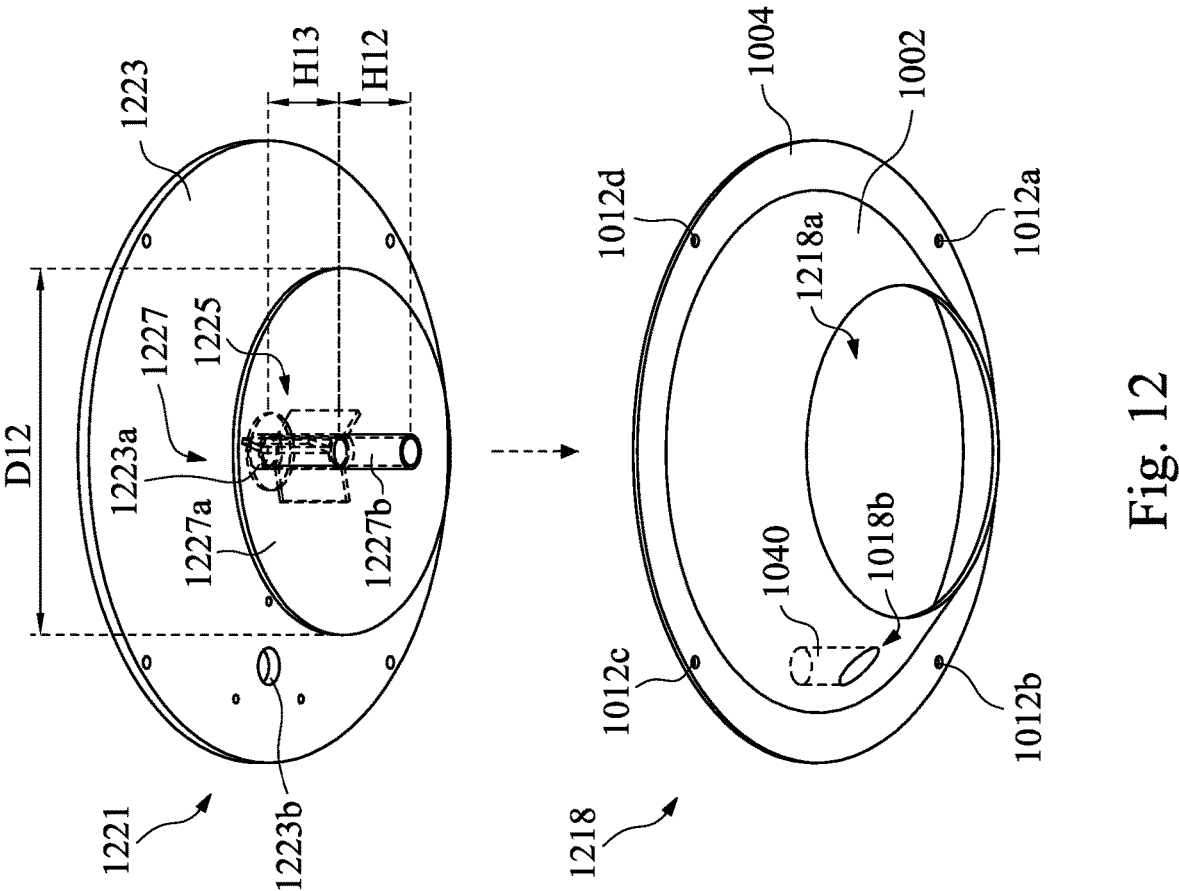
FIG. 12 illustrates a perspective view of a light guide assembly prior to securing to an inner reflector in accordance with some embodiments.

FIG. 12 illustrates a perspective view of a light guide assembly 1221 prior to securing to an inner reflector 1218 in accordance with some embodiments. In this embodiment, the inner reflector 1218 is substantially identical to the inner reflector 1018 except that the size of the bottom opening 1218a is increased. Also, the light guide assembly 1221 is substantially identical to the light guide assembly 321 of FIG. 3A except that a bridge member 1225 and a central reflector 1227 of the light guide assembly 1221 are modified in accordance with the size of the bottom opening 1218a of the inner reflector 1218. The light guide assembly 1221 includes a cover plate 1223, the central reflector 1227, and the bridge member 1225 connecting the central reflector 1227 to the cover plate 1223. Particularly, a base 1227a of the central reflector 1227 is increased in size to have an outer diameter D12 of about 90 mm to about 130 mm, such as about 100 mm to about 120 mm, for example about 110 mm. The tube 1227b is modified to have a height H12 in a range from 35 mm to about 70 mm, such as about 50 mm to about 65 mm. The bridge member 1225 is also modified to have a height H13 in a range from 20 mm to about 45 mm, such as about 25 mm to about 35 mm.

Likewise, the cover plate 1223 has a first opening 1223a and a second opening 1223b. The locations of the first and second openings 1223a, 1223b are arranged to allow passage of the focal beams 134a, 134b (FIG. 1) from the thermal radiation sensors 108a, 108b. The cover plate 1223 may have an outer diameter substantially corresponding to the outer diameter D9 of the flange 1004. The light guide assembly 1221 may be connected to the inner reflector 1218 using the support kit 400 or any of the support kits 500-900 discussed in this disclosure so long as the distance (e.g., distance D1 in FIG. 1) between the heating elements 104 and the bottom 1002b of the inner reflector 1018 is less than about 10 mm, such as about 0 mm to about 5 mm.

Figure 13:
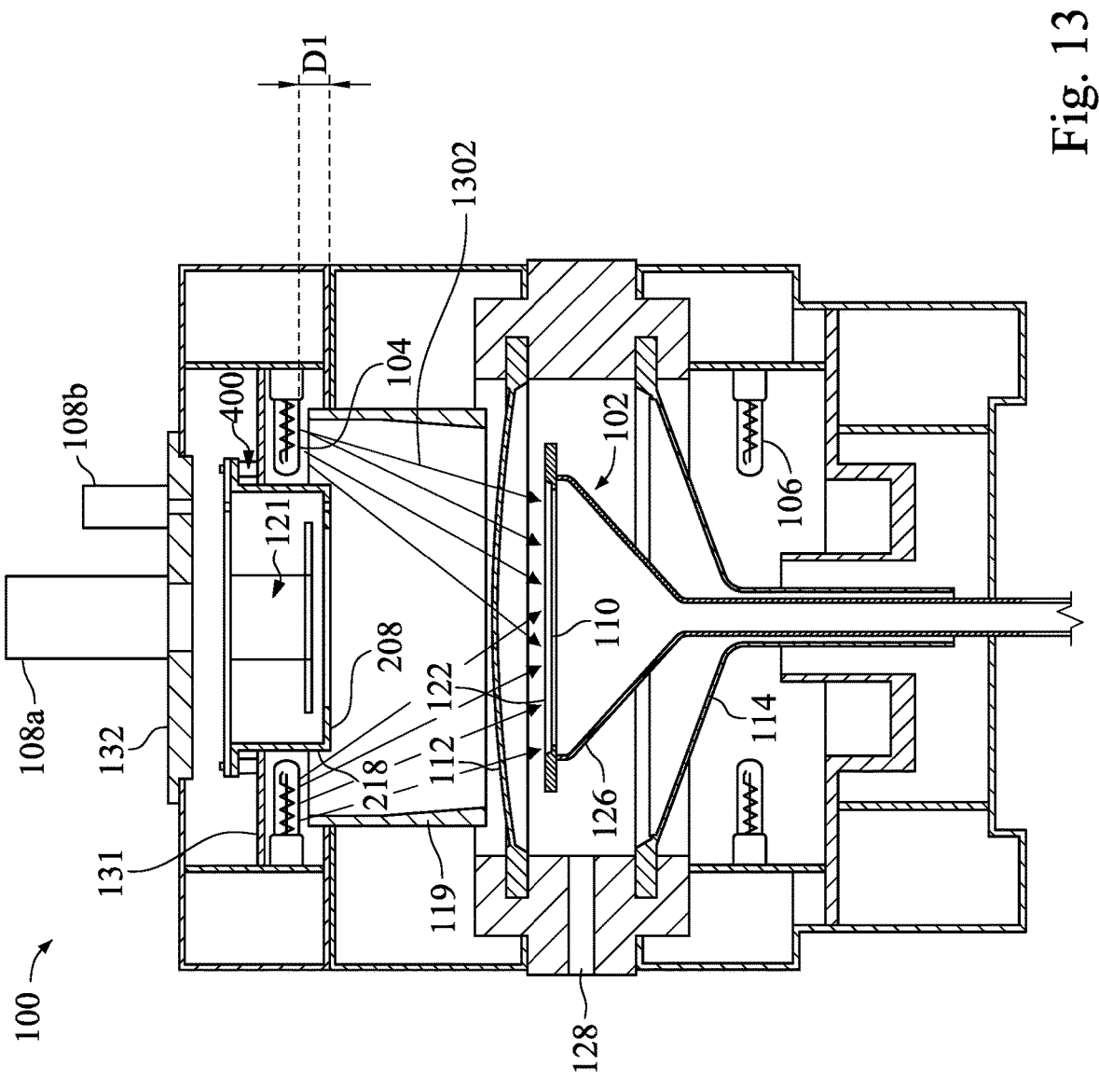
FIG. 13 a schematic cross-sectional side view of a process chamber employing an inner reflector and a support kit in accordance with some embodiments.

FIG. 13 a schematic cross-sectional side view of a process chamber 100 employing the inner reflector 218 and the support kit 400 in accordance with some embodiments. As can be seen, the use of the inner reflector 218 and the support kit 400 ensures the distance D1 between the heating elements 104 and the bottom 208 of the inner reflector 118 is kept to be less than about 50 mm, allowing radiant energy 1302 (from the heating elements 104) to be evenly directed on the substrate 110. As a result, the thickness uniformity of the deposited material across the substrate 110 is improved. It has been observed that the improvement of the thickness uniformity is also seen in other embodiments using the inner reflectors (e.g., inner reflectors 1018 and 1218) and support kits (e.g., support kits 500-900).

Various embodiments of the present disclosure provide a thermal process chamber with an assembly including at least an inner reflector and a support kit. The support kit is configurable for quick height adjustment of the inner reflector at a choice of an operator. The support kit allows the distance (e.g., distance D1 in FIG. 13) between heating elements and a bottom of the inner reflector to be 50 mm or less, allowing the heating elements to provide greater and even distribution of radiant energy on the substrate during a deposition process, such as a selective epitaxial growth, which in turn improves film thickness non-uniformity and minimizes edge roll-off phenomenon. A truncated cone shaped inner reflector is also proposed to work with the inner reflector to enhance the amount of energy radiation to be evenly distributed at the center and peripheral of the substrate. As a result, the thickness uniformity of the deposited material across the substrate is improved.

Embodiments of the present disclosure provide an assembly for use in a substrate process chamber. In one embodiment, the assembly includes a plurality of support kits, each support kit comprising a bar member, and a fastener removably coupled to the bar member, and a reflector. The reflector includes a body having a truncated cone shape, the body comprising an upper opening having a first diameter, and a bottom opening having a second diameter less than the first diameter, and a flange protruding radially from an outer circumference of the body around the upper opening. The assembly further includes a cooling plate comprising an opening sized to allow passage of the body of the reflector.

In another embodiment, a substrate processing chamber for performing an epitaxial deposition process is provided. The chamber includes a substrate support having an upper surface and a reflector disposed above the substrate support. The reflector includes a body, wherein the body comprises an upper opening having a first diameter, a bottom opening having a second diameter less than the first diameter, and a flange protruding radially from an outer circumference of the body around the upper opening, and wherein the flange comprises a plurality of holes. The chamber includes a plurality of heating elements disposed around the reflector, each heating element being operable to emit energy radiation. The chamber includes a plurality of support kits, each support kit comprising a bar member and a fastener removably coupled to the bar member, wherein the bar member and the fastener are configured to secure to the respective hole of the plurality of holes in the flange so that the reflector is at a height that reduces blockage of the energy radiation emitted from the plurality of the heating elements and increases an amount of the energy radiation to be distributed across the upper surface of the substrate support. The chamber further includes a cooling plate coupled to the flange by the plurality of support kits, wherein the cooling plate comprises an opening sized to allow passage of the body of the reflector.

Another embodiment is a substrate processing chamber for performing an epitaxial deposition process. The processing chamber includes a plurality of support kits, each support kit comprising a bar member. The bar member includes a shank and a first thread portion coupling to the shank. The shank includes a flat surface extending along entire length of the shank, and a round surface covered with a second thread portion. The support kit also includes a first fastener removably coupled to the bar member. The processing chamber further includes a reflector comprising a body having an upper opening and a bottom opening, a flange protruding radially from an outer circumference of the body around the upper opening, and a plurality of holes formed through the flange, each hole being sized to allow a portion of the bar member to pass through such that the flange is supported by the first fastener coupled to the bar member. The processing chamber further includes a plurality of heating elements disposed around the reflector, each heating element being operable to emit energy radiation, wherein the first fastener is height adjustable on the bar member to reduce blockage of energy radiation and increase the amount of the energy radiation to be distributed across an upper surface of a substrate support.

A further embodiment is a substrate process chamber. The process chamber includes a first dome, a second dome, a substrate support disposed between the first and second domes, a reflector removably disposed over the first dome. The reflector includes a body having an upper opening and a bottom opening, wherein the bottom opening is formed in a bottom of the body, and a flange protruding radially from an outer circumference of the body around the upper opening, the flange comprising a plurality of through holes. The process chamber further includes a plurality of heating elements disposed over the first dome and around the reflector, wherein a vertical distance between the bottom of the body and the heating elements is less than about 50 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A substrate processing chamber for performing an epitaxial deposition process, comprising:
    a substrate support having an upper surface;
    a reflector disposed above the substrate support, comprising:
        a body, comprising:
            an upper opening having a first diameter;
            a bottom opening having a second diameter less than the first diameter;
            a sidewall surface extending between the upper opening and the bottom opening;
            a light opening extending through the body at the sidewall; and
            a flange protruding radially from an outer circumference of the body around the upper opening, wherein the flange comprises a plurality of holes, and the light opening is disposed at the sidewall extending between the bottom opening and the flange; and
        a tube integrated to the body, the tube having a first end terminating at the light opening and a second end terminating at an elevation higher than an upper surface of the flange;
    a plurality of heating elements disposed around the reflector, each heating element being operable to emit energy radiation;
    a plurality of support kits, each support kit comprising:
        a bar member; and
        a fastener removably coupled to the bar member, wherein the fastener is operatable to secure the bar member to the respective hole of the plurality of holes in the flange; and
    a cooling plate coupled to the flange by the plurality of support kits, wherein the cooling plate comprises an opening sized to allow passage of the body of the reflector.

2. The substrate processing chamber of claim 1, wherein an exterior surface of the body and a bottom surface of the flange define an angle greater than 90 degrees.

3. The substrate processing chamber of claim 1, wherein an exterior surface of the body and a bottom surface of the flange define an angle of about 90 degrees.

4. The substrate processing chamber of claim 1, wherein the bar member further comprises:
    a shank;
    a flange portion coupled to a first end of the shank; and
    a first thread portion coupled to a second end of the shank.

5. The substrate processing chamber of claim 4, wherein the bar member further comprises:
    a second thread portion disposed between the flange portion and a head portion of the bar member.

6. The substrate processing chamber of claim 5, wherein the shank has a first height and the head portion has a second height less than the first height.

7. The substrate processing chamber of claim 4, wherein the cooling plate has a plurality of thread holes each sized to receive the first thread portion of the bar member.

8. The substrate processing chamber of claim 1, wherein the fastener is a nut-like fastener.

9. The substrate processing chamber of claim 1, wherein the tube integrated to the body is formed of a quartz material.

10. The substrate processing chamber of claim 9, wherein the tube has an inner surface arranged to guide optical signals from the light opening to a sensor positioned above the flange.

11. A substrate processing chamber, comprising:
a first dome;
a second dome;
a substrate support disposed between the first and second domes;
a reflector removably disposed over the first dome, the reflector comprising:
a body having an upper opening and a bottom opening, and a sidewall surface between the upper opening and the bottom opening;
a sensor light opening disposed at the sidewall surface;
a flange protruding radially from an outer circumference of the body around the upper opening, the flange comprising a plurality of through holes, and the sensor light opening is disposed at the sidewall surface extending between the bottom opening and the flange; and
a tube integrated to the body, the tube having a first end terminating at the sensor light opening and a second end terminating at an elevation higher than an upper surface of the flange; and
a plurality of heating elements disposed over the first dome and around the reflector, wherein a vertical distance between the bottom of the body and the heating elements is less than about 50 mm.

12. The substrate processing chamber of claim 11, further comprising:
a plurality of support kits, each support kit comprising:
a bar member, comprising:
a first thread portion; and
a shank coupled to the first thread portion; and
a first fastener removably coupled to the shank, wherein the shank and the first fastener are operable to secure the flange at a position between the shank and the first fastener.

13. The substrate processing chamber of claim 12, further comprising:
a cooling plate, comprising:
an opening sized to allow passage of the body of the reflector; and
a plurality of threaded holes on the cooling plate, each threaded hole being configured to accommodate the first thread portion of the bar member.

14. The substrate processing chamber of claim 11, wherein the body has a truncated cone shape.

15. The substrate processing chamber of claim 11, wherein the sensor light opening is disposed between the bottom opening and the flange.

16. A substrate processing chamber, comprising:
a rotatable substrate support;
a reflector removably disposed over the substrate support, the reflector comprising:
a body having a first opening, a second opening having a diameter less than that of the first opening, and a sidewall surface extending at an angle from the first opening to the second opening;
a flange extending radially from an outer circumference of the body;
a light opening disposed at the sidewall surface which extends between the second opening and the flange; and
a tube integrated to the body, the tube having a first end terminating at the light opening and a second end terminating at an elevation higher than an upper surface of the flange; and
a cooling plate having an opening sized to allow the body of the reflector to pass through; and
a plurality of support kits for securing the reflector, each support kit comprising:
a bar member removably coupled to the cooling plate; and
a fastener operable to secure the flange of the reflector to the bar member.

17. The substrate processing chamber of claim 16, further comprising:
a light guide assembly removably disposed on the reflector, comprising:
a cover plate comprising a plurality of holes each sized to allow a portion of the bar member to pass through;
a central reflector; and
a bridge member connecting the central reflector to the cover plate.

18. The substrate processing chamber of claim 17, wherein the cover plate further comprises:
a first opening disposed at the center of the cover plate, the first opening being configured to receive the central reflector; and
a second opening disposed at an edge of the cover plate.

19. The substrate processing chamber of claim 18, wherein the body has a bottom, and the bottom has a third opening aligned with the second opening.

20. The substrate processing chamber of claim 19, wherein the sidewall surface further comprises:
a fourth opening; and
a tube integrated to the fourth opening, wherein the tube, the fourth opening, and the second opening are aligned.

* * * * *